United States Patent [19]
Falzone

[11] Patent Number: 5,878,811
[45] Date of Patent: Mar. 9, 1999

[54] APPARATUS AND METHOD FOR THE CONTROLLED COOLING OF CHEMICAL TANKS

[75] Inventor: Alberto Falzone, Catania, Italy

[73] Assignee: Consorzio per la Ricerca sulla Microelttronica nel Mezzogiorno, Catania, Italy

[21] Appl. No.: 527,408

[22] Filed: Sep. 13, 1995

[30] Foreign Application Priority Data

Sep. 20, 1994 [EP] European Pat. Off. .............. 94830440

[51] Int. Cl.$^6$ ................................................. F25B 29/00
[52] U.S. Cl. .................... 165/255; 165/256; 165/259; 165/108; 62/434; 62/435
[58] Field of Search ............................ 62/185, 434, 435; 165/253, 254, 255, 256, 258, 259, 260, 261, 262, 264, 108; 422/200

[56] References Cited

U.S. PATENT DOCUMENTS

| | | | |
|---|---|---|---|
| 2,645,461 | 7/1953 | Brown et al. | 165/259 |
| 2,835,477 | 5/1958 | Tovrog et al. | 165/264 |
| 2,943,842 | 7/1960 | Sullivan | 165/236 |
| 3,156,101 | 11/1964 | McGuffey | 62/434 |
| 3,393,729 | 7/1968 | Sauer | 165/61 |
| 3,729,948 | 5/1973 | Schwartz | 62/185 |
| 4,246,955 | 1/1981 | Skala | 165/236 |

FOREIGN PATENT DOCUMENTS

| | | | |
|---|---|---|---|
| A-0 507 387 | 10/1992 | European Pat. Off. | ........ H01L 21/00 |
| 2245966 | 5/1973 | Germany | 165/61 |
| 0031890 | 3/1979 | Japan | 165/61 |

OTHER PUBLICATIONS

European Search Report from European Patent Application Serial Number 94830440.7, filed Sep. 20, 1994.
Patent Abstracts of Japan, vol. 12, No. 318 (E–650), Aug. 29, 1988 of JP–A–63 081932 (Hitachi Ltd).

*Primary Examiner*—John K. Ford
*Attorney, Agent, or Firm*—Wolf, Greenfield & Sacks, P.C.

[57] ABSTRACT

An apparatus for the controlled cooling of chemical tanks containing a chemical which must be kept at a first prescribed temperature includes at least one heat-exchanger coil immersed inside a chemical tank and through which there is made to circulate a flow of an inert gas. The apparatus includes a storage system for storing and cooling a prescribed volume of inert gas at a second prescribed temperature lower than the first prescribed temperature, feeding means for feeding the storage means with inert gas coming from a main supply line, and valve means interposed between the storage means and an inlet of the at least one heat-exchanger coil for controlling the supply of cooled inert gas to the heat-changer coil.

11 Claims, 2 Drawing Sheets

APPARATUS AND METHOD FOR THE CONTROLLED COOLING OF CHEMICAL TANKS

BACKGROUND OF THE INVENTION

1. Field of the Invention

The present invention relates to an apparatus and method for the controlled cooling of chemical tanks.

2. Discussion of the Related Art

In microelectronics industry, the manufacturing of integrated circuits involves several steps of liquid-based or "wet" etching: the silicon wafers are immersed in rather capacious tanks (to allow the simultaneous processing of several wafers) containing a chemical solution whose composition and temperature depend on the particular material to be etched.

In some cases the etching process is carried out at temperatures higher than the room temperature (21° C.): the etching solution must be maintained within a temperature range from 28° C. to 38° C., for which purpose means for heating the etching solution are necessary.

There is a class of materials for which the etching process is carried out at room temperature. In this class, some materials, such as silicon, react with the etching solution generating heat (i.e., the reaction is exothermic). If no cooling means are provided, the heat generated by the reaction causes an increase in the temperature of the etching solution which modifies (increases) the reaction speed, and the etching process goes out of control. As a result, several wafers must be rejected.

Also, as evident, cooling means are necessary when the etching process is carried out at temperatures lower than the room temperature.

According to the known art, the cooling means include teflon coils which are immersed in the etching solution and through which water is made to flow. The coils are connected to an external tank to which a refrigerating system is associated. A temperature sensor immersed in the etching solution controls the refrigerating system to maintain the etching solution in the desired temperature range.

The problem is that, with use and handling due to cleaning, microfractures are created in the teflon coils, through which the water leaks out contaminating the etching solution with ions present in the water. Such ions deposit on the silicon wafers and give rise to defects that cause the wafers to be rejected.

In the published European Patent Application No. 507387 a device for heating chemical tanks is described which includes a pair of heat-exchanger teflon coils, immersed in the etching solution, through which an inert gas such as pure nitrogen is made to flow. The coils are connected to respective heating units which are fed with the inert gas from a main supply line. The use of an inert gas as the heating element instead of water assures that, even in presence of microfractures in the teflon coils through which the gas can leak, the etching solution is not contaminated.

In view of the state of the art described, it is an object of the present invention to provide an apparatus and method for the controlled cooling of chemical tanks used for wet etching of semiconductor wafers, which is safe and reduces the chance of contamination of the etching solution.

SUMMARY OF THE INVENTION

According to the present invention, at least this object is attained by an apparatus for the controlled cooling of chemical tanks containing a chemical solution which must be kept at a first prescribed temperature, comprising at least one heat-exchanger coil immersed inside of a chemical tank and through which there is made to circulate a flow of an inert gas, comprising a storage system for storing and cooling a prescribed volume of inert gas at a second prescribed temperature lower than said first prescribed temperature, a feeding system for feeding the storage system with inert gas coming from a main supply line, and a valve system interposed between said storage means and an inlet of said at least one heat-exchanger coil for controlling the supply of cooled inert gas to the heat-exchanger coil.

The apparatus according to the present invention does not pose any problem of contamination of the solution, since it uses an inert gas as cooling element. Furthermore, as a result the fact that a storage system for storing cool inert gas is provided, the cooling apparatus of the present invention is capable of rapidly compensating any undesired temperature increase in the chemical solution, as a result of, for example the heat generated by the etching reaction. To achieve this result, it is sufficient to properly dimension the storage system to store a sufficient volume of cool inert gas.

BRIEF DESCRIPTION OF THE DRAWINGS

The features of the present invention will be made more evident by the following detailed description of one practical embodiment, described as a non-limiting example in the annexed drawings, wherein.

DETAILED DESCRIPTION

Figure 1:
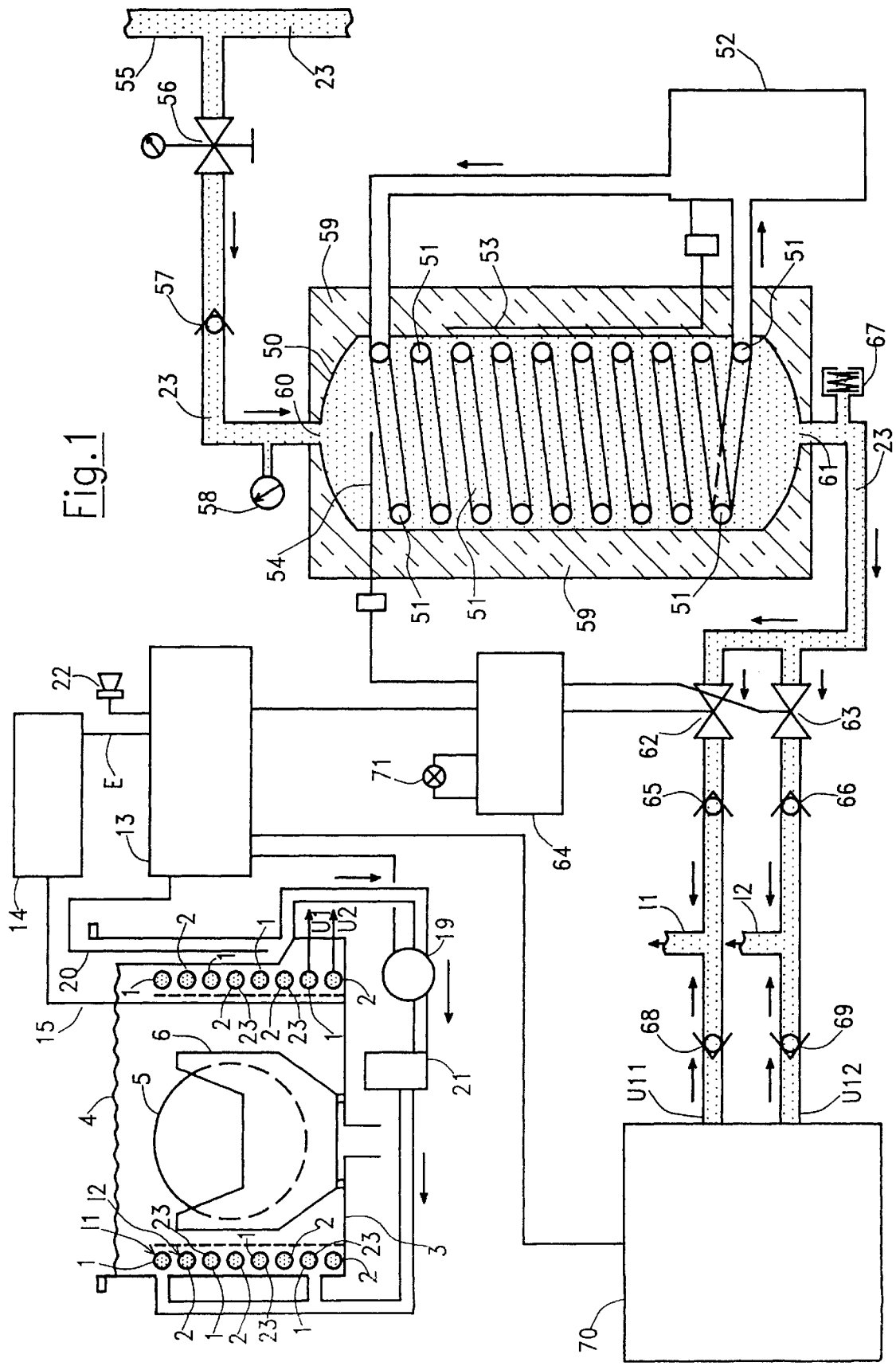
FIG. 1 is a schematic view of a chemical tank and of an apparatus for the controlled cooling of the chemical tank according to the present invention.

With reference to FIG. 1, first and second heat-exchanger coils 1, 2 are arranged and intercalated one to the other in the proximity of the walls of a chemical tank 3 containing a chemical solution 4 suitable for etching silicon wafers 5 (only one shown in the drawing) which in turn contains corresponding containers 6. The tank 3 has a typical volume of about 24 l, and the solution is, for example, a mixture of hydrofluoric acid and ammonium fluoride in the proportion of one to seven by volume.

The tank 3 is provided with a pump 19 having a corresponding filter 21 for the filtered recirculation of the solution 4, and with an associated level control 20 connected to an input of a main control unit 13 and suitable for stopping the recirculation pump 19 in case of an excessive lowering of the level of the solution 4 in the tank 3.

The coils 1, 2 are made of teflon and are both traversed by a flow of an inert gas 23, such as pure nitrogen, that enters into the coils 1, 2 through respective inlets I1, I2 and leaves the coils 1, 2 from respective discharge outlets U1, U2.

The cooling apparatus comprises a cylindrical container 50 made of stainless steel having a volume of about 25 l, inside which there is arranged a heat-exchanger coil 51 also made of stainless steel, in a position adjacent to the walls of the container 50. The coil 51 is the expansion coil of a per-se known refrigerating machine 52. The container 50 has a coating 59 of thermal insulator material.

The container 50 has an inlet 60 at its top end which is fed with the inert gas 23 coming from a main supply line 55 through a pressure regulator 56 and a nonreturn valve 57. A pressure gauge 58 measures the pressure of the inert gas 23 downstream from the nonreturn valve 57 and just upstream of the inlet 60.

The container 50 has an outlet 61 at its bottom end through which the cooled inert gas 23 is fed to the coils 1, 2 respectively through a first linearly-operating solenoid valve 62 and a second linearly-operating solenoid valve 63, which are individually controlled by a peripheral control unit 64. The first and second linearly-operating valves 62 and 63 are respectively connected to the inlets I1, I2 of the coils 1, 2 through respective nonreturn valves 65 and 66. Just downstream from the outlet 61 of the container 50 there is provided a relief valve 67 which discharges the inert gas 23 from the container 50 in case of overpressure.

The activation of the refrigerating machine 52 is controlled by a thermostat 53 externally attached to the wall of the container 50. The temperature of the inert gas 23 inside the container 50 is measured by a sensor 54 which is connected to the peripheral control unit 64.

The peripheral control unit 64 communicates with the main control unit 13, which is also connected to a temperature controller 14 suitable for receiving from a thermocouple 15 signals related to the temperature of the solution 4 and for sending to the main control unit 13 a signal E equal to the deviation between the detected temperature and the preset temperature. The main control unit 13 is further provided with an alarm device 22 suitable for providing an operator with an acoustical signal in case of malfunctions in the apparatus.

Figure 2:
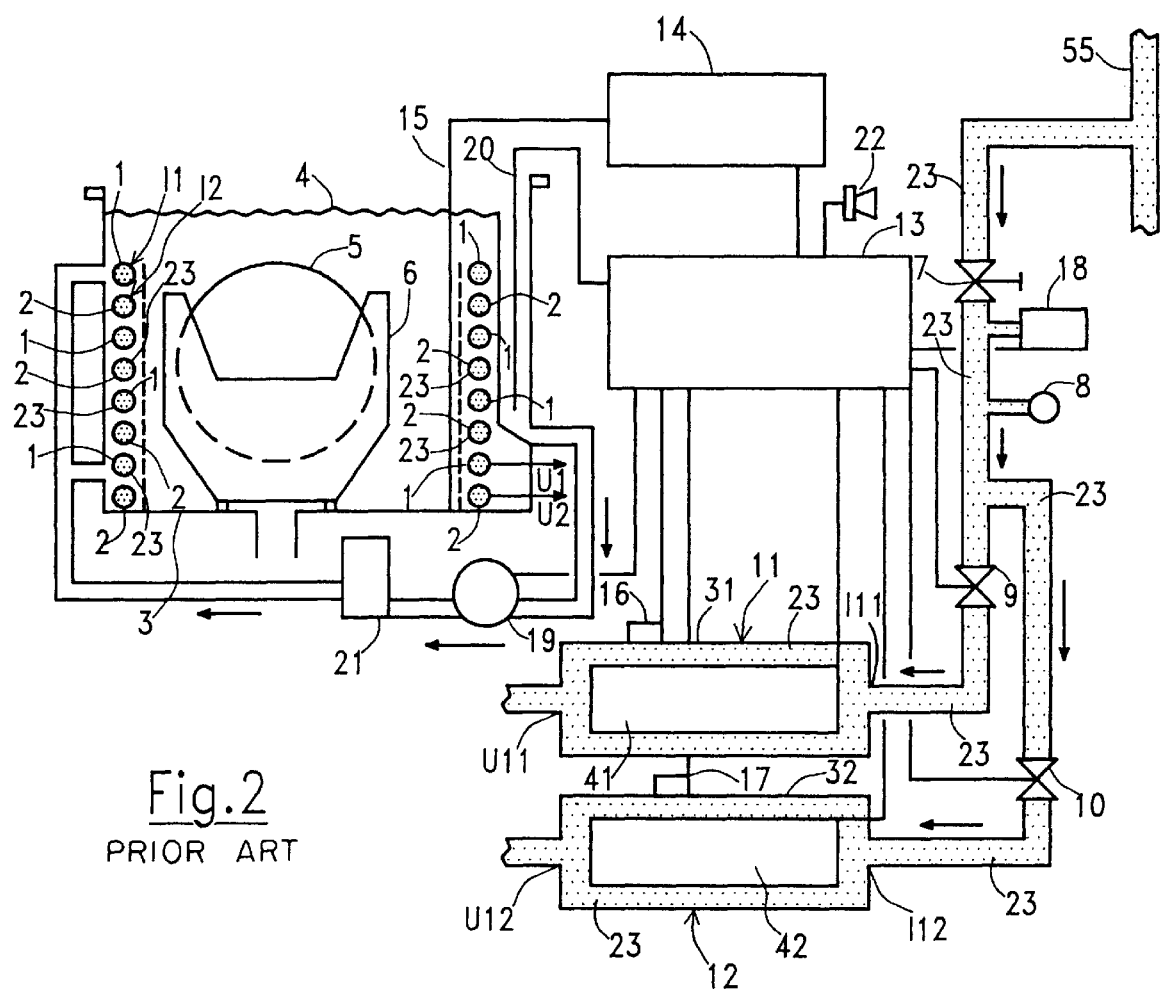
FIG. 2 is a schematic view of the chemical tank and of a device for heating the inert gas.

The cooling apparatus according to the preferred embodiment of the present invention also comprises a heating device schematically shown in FIG. 1 by a block 70 and substantially of the type described in the already mentioned European Patent Application No. 507387. The heating device, shown in detail in FIG. 2, comprises first and second inert gas heating units 11, 12 each including of a shell 31, 32 having a cylindrical shape which houses a respective electrical resistance 41, 42 inside it.

The heating units 11, 12 have respective inlets I11, I12 fed with the inert gas coming from the main supply line 55 through a common pressure regulator 7 and respective solenoid valves 9, 10, which are individually controlled by the main control unit 13. Just downstream from the pressure regulator 7, which sets a maximum pressure of about 1 bar, a safety pressure switch 18 is inserted in the line feeding the inert gas 23 to the solenoid valves 9, 10 and is suitable for transmitting to the main control unit 13 a signal for automatically switching the heating units 11, 12 off in the case of a pressure fall of the inert gas 23 in the main supply line 55 so as not to damage the heating elements 11, 12 themselves.

The heating units 11, 12 are driven by the main control unit 13 and are further provided with safety control means 16, 17 of excess temperature, which intervene in case of anomalies in the heating units 11, 12. One of the two solenoid valves 9 and 10, e.g. the valve 9, is controlled by the main control unit 13 in an impulsive manner, while the other valve 10 is controlled in a linear manner.

The heating units 11, 12 have respective outlets U11 and U12 which are respectively connected, through respective nonreturn valves 68 and 69, to the inlets I1 and I2 of the coils 1 and 2.

The inert gas 23 coming from the main supply line 55 is fed to the container 50 through the pressure regulator 56 and the nonreturn valve 57. The pressure regulator 56 limits the pressure downstream from it to a value of about 7–8 bar, lower than the pressure of the inert gas 23 in the main supply line 55 (typically 10–12 bar). Inside the container 50, the inert gas 23 is progressively cooled to the temperature set by the thermostat 53 (for example 2°–4° C.). As the inert gas cools, the pressure inside the container 50 lowers, and more gas is taken in from the main supply line 55, until the pressure inside the container 50 reaches the value set by the pressure regulator 56.

Hence, the container 50 works as a reservoir of cool gas for refrigerating the etching solution 4, the volume of the container 50 and the temperature at which it is kept being chosen so as to store a number of refrigerating units at least sufficient to rapidly compensate the heat that can be generated by the chemical reaction of etching of the silicon wafers.

When the temperature of the inert gas inside the container 50, measured by the thermal sensor 54, reaches the preset value stored in the peripheral control unit 64, the peripheral control unit 64 signals to the main control unit 13 a "ready" condition, and also activates a "ready" device 71 (e.g. a lamp) for the operator.

Figure 3:
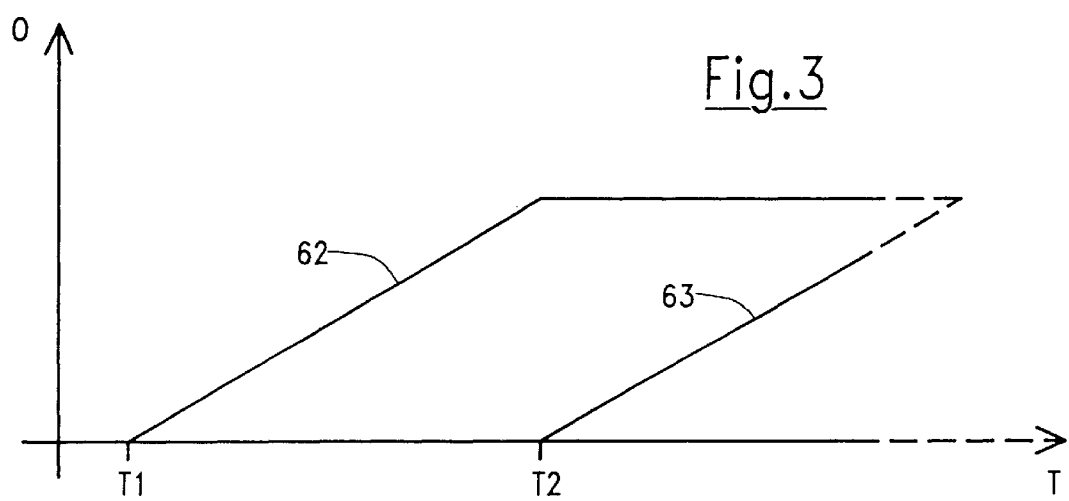
FIG. 3 is a diagram showing the opening characteristics of two valves of the cooling apparatus with respect to temperature.

For the purpose of controlling the reaction speed and thus the rate of removal of the material to be etched, the chemical solution 4 must be maintained at a prescribed temperature (T1 in FIG. 3), with maximum allowed variations within a narrow temperature range (for example, T1+(T2−T1) in FIG. 3). For example, in the case of a room temperature etching process, the prescribed temperature T1 is 21 ° C., and the allowed temperature range is 21 ° C. +0.5° C.(i.e. T2=21.5° C.).

After the "ready" condition is signalled to the operator by the peripheral control unit 64, the container 6 of silicon wafers 5 is introduced into the tank 3 containing the etching solution 4. The etching solution 4 reacts with the material to be etched. The chemical reaction that takes place is, in some cases, exothermic: thus, the heat generated by the reaction causes the temperature of the solution 4 to rise. The temperature of the solution 4 is detected by the temperature controller 14, which supplies the main control unit 13 with the signal E corresponding to the deviation of the detected temperature with respect to the preset temperature, for example 21° C. for a room temperature etching process. If the value of said deviation is positive, the main control unit 13 sends a command to the peripheral control unit 64 to open the linearly-operating valves 62, 63. As long as the deviation does not exceed 0.5 ° C., i.e. as long as the temperature T of the solution 4 does not exceed T2 in FIG. 3, only one of the two valves 62, 63 is opened (for example the valve 62), proportionally to the amount of the deviation up to the maximum opening for T=T2. If instead the deviation from the prescribed temperature exceeds 0.5° C., both the valves 62, 63 are opened, the valve 62 at its maximum opening and the valve 63 proportionally to the difference between the temperature T of the solution and T2, so that the temperature of the solution 4 can quickly return into the allowed temperature range. FIG. 3 shows the opening characteristics of the valves 62, 63 with temperature. As cool gas 23 leaves the container 50, the pressure in the container 50 decreases, and other gas is taken in from the main supply line 55.

As the temperature of the solution 4 approaches the preset value, the valves 62, 63 are progressively closed, again according to the characteristic of FIG. 3.

If, due to the thermal inertia of the system, the temperature of the solution decreases below the preset value, the main control unit 13 determines the activation of the heating units 11, 12. As long as the deviation of the detected temperature from the preset temperature is small (i.e. the detected temperature is in the allowed range 20.5° C.–21° C.), the main control unit 13 impulsively drive the valve 9 with a pulsed signal having a duty cycle depending on the amount of the temperature deviation; the other valve 10 is kept closed. The hot gas at the outlet U11 of the heating unit 11 is fed, via the nonreturn valve 68, to the inlet I1 of the coil 1. When instead the temperature deviation is large (i.e. when the detected temperature falls outside the allowed range 20.5° C. –21° C.), the valve 9 is kept open, and the valve 10 is linearly controlled in a manner proportional to the difference between the detected temperature and the minimum allowed temperature (20.5° C.). The hot gas is fed to both the coils 1, 2, so that the temperature of the solution can quickly return to the allowed temperature range.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Apparatus for the controlled cooling of chemical tanks containing a chemical solution which must be kept at a first prescribed temperature, including at least one heat-exchanger coil immersed inside a chemical tank and through which there is made to circulate a flow of an inert gas, comprising:

storage means for storing and cooling a prescribed volume of inert gas at a second prescribed temperature lower than said first prescribed temperature:

feeding means for feeding the storage means with inert gas coming from a main supply line; and valve means interposed between said storage means and an inlet of said at least one heat-exchanger coil for controlling the supply of cooled inert gas to the heat-exchanger coil;

wherein the storage means comprises a container for the inert gas and refrigerating means associated with the container, said container having an inlet coupled to said feeding means and an outlet coupled to said valve means;

wherein the refrigerating means comprises a refrigerating machine having an expansion coil located inside of the container; and wherein the feeding means comprises a pressure regulator which is set to allow the intake of the inert gas from the main supply line until a prescribed pressure inside the container is reached, and a nonreturn valve interposed between the pressure regulator and the inlet of the container.

2. Apparatus according to claim 1, further comprising sensing means for measuring the temperature of the chemical solution inside the tank, and control means for activating said valve means when said temperature of the chemical solution inside the tank exceeds said first prescribed temperature.

3. Apparatus according to claim 2, wherein the at least one heat-exchanging coil comprises a first coil and a second coil intercalated one to the other, said valve means comprises first valve means, interposed between the outlet of the container and an inlet of the first coil, and second valve means interposed between the outlet of the container and an inlet of the second coil.

4. Apparatus according to claim 3, wherein the first valve means is activated when the temperature of the chemical solution in the tank exceeds said first prescribed temperature, and said second valve means is activated when the temperature of the chemical solution in the tank exceeds a third prescribed temperature higher than the first prescribed temperature.

5. Apparatus according to claim 4, wherein the first and second valve means respectively comprise first and second linearly operating valves, the opening of said first linearly operating valve being controlled by the control means in a manner proportional to the difference between the temperature of the chemical solution inside the tank and said first prescribed temperature, and the opening of said second linearly operating valve being controlled by the control means in a manner proportional to the difference between the temperature of the chemical solution inside the tank and said third prescribed temperature.

6. Apparatus according to claim 5, wherein the first and second valve means further comprise two nonreturn valves each inserted between a respective linearly operating valve and a respective inlet of said two heat-exchanging coils.

7. Apparatus according to claim 6, further comprising a device for heating the inert gas, said device comprising first and second heating units each having a respective inlet for the inert gas, respective valve means controlling the flow of the inert gas into the heating units, and a respective outlet coupled to the inlet of the first and second heat-exchanging coils, respectively.

8. Apparatus according to claim 7, wherein when the temperature of the chemical solution in the tank falls below the first prescribed temperature said control means activate at least one of said heating units.

9. Apparatus according to claim 8, wherein one of said heating units is controlled by said control means in a linear manner, and the other of said heating units is controlled by said control means in an impulsive manner.

10. Apparatus according to claim 9, wherein between the outlets of the heating units and the inlets of the respective heat-exchange coils there are inserted nonreturn valves.

11. Method for the controlled cooling of chemical tanks containing a chemical solution which must be kept at a first prescribed temperature, comprising the steps of:

storing a prescribed volume of an inert gas and cooling it at a second prescribed temperature lower than said first prescribed temperature;

continuously detecting a temperature of the chemical solution inside the chemical tank; and controlling a flow of the stored cooled inert gas into at least one heat exchanger tube immersed in the chemical solution;

wherein the step of controlling includes controlling the flow of the stored cooled inert gas into a first heat exchanger tube immersed in the chemical solution in a linear manner proportional to the difference between the temperature of the chemical solution and said first prescribed temperature, and controlling the flow of the stored cooled inert gas into a second heat exchanger tube immersed in the chemical solution in a linear manner proportional to the difference between the temperature of the chemical solution and a third prescribed temperature higher than said first prescribed temperature.

* * * * *

UNITED STATES PATENT AND TRADEMARK OFFICE
CERTIFICATE OF CORRECTION

PATENT NO. : 5,878,811
DATED : March 9, 1999
INVENTOR(S) : Alberto Falzone

It is certified that error appears in the above-identified patent and that said Letters Patent is hereby corrected as shown below:

On the title page items [75] and [73] should read as follows:

Inventor: Alberto Falzone, Aci Catena, Italy

Consorzio per la Ricerca sulla Microelettronica nel Mezzogiorno, Catania, Italy

Signed and Sealed this

Twenty-ninth Day of June, 1999

*Attest:*

Q. TODD DICKINSON

*Attesting Officer*     Acting Commissioner of Patents and Trademarks